US012772704B2

(12) United States Patent
Lee et al.

(10) Patent No.: US 12,772,704 B2
(45) Date of Patent: Oct. 20, 2026

(54) LIGHT EMITTING DISPLAY DEVICE

(71) Applicant: LG Display Co., Ltd., Seoul (KR)

(72) Inventors: Geumyoung Lee, Gimpo-si (KR); JeongOh Kim, Goyang-si (KR); MyungJae Yoo, Paju-si (KR); SeongHo Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 495 days.

(21) Appl. No.: 18/083,233

(22) Filed: Dec. 16, 2022

(65) Prior Publication Data

US 2023/0209873 A1 Jun. 29, 2023

(30) Foreign Application Priority Data

Dec. 29, 2021 (KR) ........................ 10-2021-0190968

(51) Int. Cl.
*H10K 59/80* (2023.01)
*H10K 59/122* (2023.01)

(52) U.S. Cl.
CPC ......... *H10K 59/874* (2023.02); *H10K 59/122* (2023.02)

(58) Field of Classification Search
CPC .. H10K 50/846; H10K 59/122; H10K 59/874; H10K 59/873; H10K 50/844; H10K 59/80522; H10K 59/8052; H10H 29/142; H10H 20/854; H10H 20/852; H10D 30/6755
See application file for complete search history.

(56) References Cited

U.S. PATENT DOCUMENTS

2002/0001750 A1* 1/2002 Matsuura .............. H01M 10/26 429/218.2
2016/0087241 A1* 3/2016 Kim ....................... H10K 59/87 438/23
2019/0165062 A1* 5/2019 Heo ................... H10K 50/8428
2019/0165298 A1* 5/2019 Lee ...................... H10K 59/873
2019/0165326 A1 5/2019 Kim et al.
2019/0198811 A1* 6/2019 Choi .................... H10K 59/874

(Continued)

FOREIGN PATENT DOCUMENTS

CN 110010779 A 7/2019
CN 111244131 A 6/2020

(Continued)

OTHER PUBLICATIONS

Translation of KR-20160073620-A, Gee Moon Bae, "Organic Light Emitting Display Device", (Year: 2016).*

(Continued)

*Primary Examiner* — Jacob Y Choi
*Assistant Examiner* — Ashley Nicole Blackwell
(74) *Attorney, Agent, or Firm* — Morgan, Lewis & Bockius LLP

(57) ABSTRACT

According to an exemplary embodiment of the present disclosure, a light emitting display device includes a transistor disposed on a substrate, a planarization layer disposed on the transistor, a light emitting diode disposed on the planarization layer, a bank layer disposed in a non-emitting area so as to define an emitting area of the light emitting diode, a hydrogen trapping layer disposed in the non-emitting area, and an encapsulation layer disposed on the bank layer and the hydrogen trapping layer.

18 Claims, 9 Drawing Sheets

(56) References Cited

U.S. PATENT DOCUMENTS

| | | | | |
|---|---|---|---|---|
| 2020/0152913 | A1* | 5/2020 | Noh | H10K 50/8445 |
| 2020/0381650 | A1* | 12/2020 | Shin | H10K 59/873 |
| 2022/0190286 | A1* | 6/2022 | Lee | H10K 59/8731 |

FOREIGN PATENT DOCUMENTS

| | | | | | |
|---|---|---|---|---|---|
| KR | 10-2015-0033345 | A | | 4/2015 | |
| KR | 10-2016-0073620 | A | | 6/2016 | |
| KR | 20160073620 | A | * | 6/2016 | H10D 30/6755 |
| KR | 10-2019-0064051 | A | | 6/2019 | |
| KR | 10-2019-0064197 | A | | 6/2019 | |
| KR | 10-2020-0082752 | A | | 7/2020 | |
| KR | 10-2021-0000184 | A | | 1/2021 | |

OTHER PUBLICATIONS

Office Action dated Jun. 10, 2025 issued in counterpart KR Application No. 10-2021-0190968.

* cited by examiner

LIGHT EMITTING DISPLAY DEVICE

CROSS-REFERENCE TO RELATED APPLICATIONS

This application claims the priority of Korean Patent Application No. 10-2021-0190968 filed on Dec. 29, 2021, in the Korean Intellectual Property Office, the disclosure of which is incorporated herein by reference.

BACKGROUND

Technical Field

The present disclosure relates to a light emitting display device, and more particularly, to a light emitting display device which reduces or suppresses degradation of a characteristic of an oxide semiconductor.

Discussion of the Related Art

As it enters a full-scale information era, a field of a display device which visually expresses electrical information signals has been rapidly developed and studies are continued to improve performances of various display devices such as a thin thickness, a light weight, and low power consumption.

Among various display devices, a light emitting display device is a self-emitting display device so that a separate light source is not necessary, which is different from a liquid crystal display device. Therefore, the light emitting display device may be manufactured to have a light weight and a small thickness. Further, the light emitting display device uses a light emitting diode (LED) which is a self-emitting device to have advantages such as fast response speed and large luminous efficiency, luminance, and viewing angle.

The light emitting display device transmits a gate signal and a data signal which drive the light emitting diode to the light emitting diode using a plurality of transistors. Such a transistor includes a semiconductor layer of a semiconductor material such as silicon. In recent years, the transistor including a semiconductor layer of an oxide semiconductor material is frequently used for the light emitting display device with advantages of an excellent device characteristic and a simple manufacturing process which reduces a manufacturing cost.

However, the transistor including the semiconductor layer of an oxide semiconductor material has a disadvantage in that the electric characteristic of the transistor is degraded due to hydrogen (H). Specifically, when an encapsulation including a plurality of inorganic layers, that is, an encapsulation layer is disposed thereabove, hydrogen of the encapsulation layer spreads into the semiconductor layer of the transistor so that there is a problem in that a threshold voltage Vth of the transistor fluctuates.

SUMMARY

Accordingly, embodiments of the present disclosure are directed to a light emitting display device that substantially obviates one or more of the problems due to limitations and disadvantages of the related art.

An aspect of the present disclosure is to provide a light emitting display device which improves a structure of a bank layer of a non-emitting area so that hydrogen of the encapsulation layer is not spread onto the transistor.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display device comprises a transistor disposed on a substrate, a planarization layer disposed on the transistor, a light emitting diode disposed on the planarization layer, a bank layer disposed in a non-emitting area so as to define an emitting area of the light emitting diode, a hydrogen trapping layer disposed in the non-emitting area, and an encapsulation layer disposed on the bank layer and the hydrogen trapping layer.

In another aspect, a light emitting display device comprises a transistor disposed on a substrate, a planarization layer disposed on the transistor, a light emitting diode formed by sequentially disposing a first electrode, a light emitting layer, and a second electrode on the planarization layer, a bank layer disposed in a non-emitting area so as to define an emitting area of the light emitting diode, a first hydrogen trapping layer disposed on the planarization layer of the non-emitting area, a second hydrogen trapping layer which is disposed on the first hydrogen trapping layer so as to overlap the first hydrogen trapping layer, and an encapsulation layer disposed on the bank layer and the second hydrogen trapping layer.

Other detailed matters of the exemplary embodiments are included in the detailed description and the drawings.

According to the present disclosure, a hydrogen trapping layer is formed on the bank layer so that hydrogen in the encapsulation layer does not affect the transistor, thereby improving the reliability of the light emitting display device.

Further, according to the present disclosure, a hydrogen trapping assisting layer having a rough surface (e.g., a first hydrogen trapping layer) is formed in an area overlapping a hydrogen trapping layer which stably couples to hydrogen (e.g., a second hydrogen trapping layer). Therefore, a surface of the hydrogen trapping layer is formed to be large to improve a hydrogen trapping effect.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
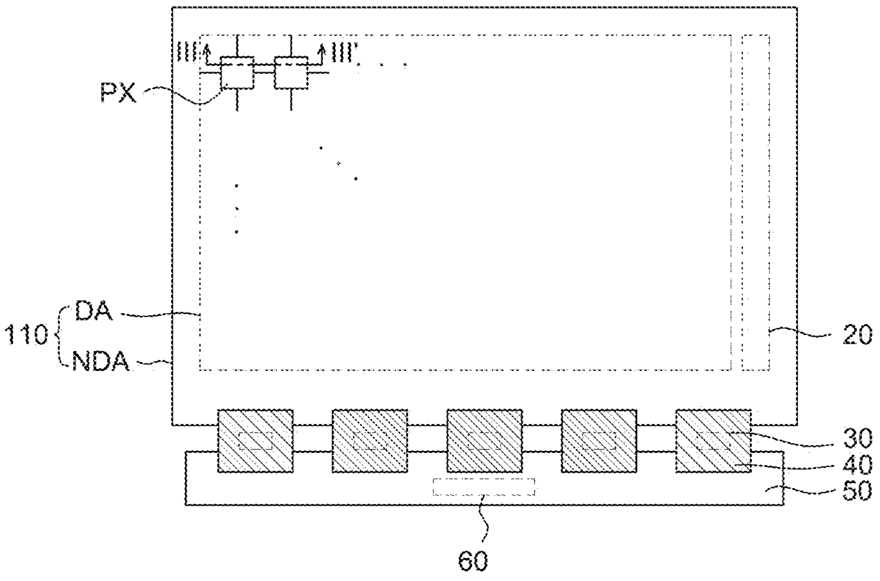
FIG. 1 is a schematic plan view of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other layer or element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a plan view of a light emitting display device according to an exemplary embodiment of the present disclosure.

Referring to FIG. 1, a light emitting display device 100 according to an exemplary embodiment of the present disclosure includes a display panel 110, a gate driver 20, a data driver 30, a flexible film 40, a circuit board 50, and a timing controller 60.

The display panel 110 is divided into a display area DA in which images are displayed and a non-display area NDA in which images are not displayed. In the display area DA, gate lines, data lines, and pixels PX are disposed and in the non-display area NDA, the gate driver 20 and pads are disposed.

Each of pixels PX includes a transistor and a light emitting diode including a first electrode, a light emitting layer, and a second electrode. When a gate signal is input from the gate line, each pixel PX supplies a predetermined current to the light emitting diode according to a data voltage of the data line, using the transistor. By doing this, the light emitting diode of each pixel PX may emit light with a predetermined brightness according to the predetermined current. The detailed structure of each pixel PX will be described in more detail with reference to FIGS. 2 to 9.

The gate driver 20 supplies a gate signal to the gate lines according to a gate control signal input from the timing controller 60. The gate driver 20 may be disposed in a gate in panel (GIP) manner in a non-display area NDA at one or both outsides of the display area DA of the display panel 110. Alternatively, the gate driver 20 may be manufactured as a driving chip to be mounted in a flexible film or attached at one or both outsides of the display area DA of the display panel 110 in a tape automated bonding (TAB) manner.

The data driver 30 receives digital video data and a source control signal from the timing controller 60. The data driver 30 converts digital video data into analog data voltages according to a source control signal to supply the analog data voltages to the data lines.

In the non-display area NDA of the display panel 110, pads such as data pads may be formed. In the flexible film 40, wiring lines which connects the pads and the data driver 30 and wiring lines which connect the pads and wiring lines of the circuit board 50 may be disposed. The flexible film 40 is attached onto the pads using an anisotropic conducting film to connect the pads and the wiring lines of the flexible film 40.

The circuit board 50 may be attached to the flexible films 40. In the circuit board 50, a plurality of circuits which is implemented by driving chips may be mounted. For example, the timing controller 60 may be mounted on the circuit board 50. The circuit board 50 may be a printed circuit board or a flexible printed circuit board.

The timing controller 60 receives digital video data and a timing signal from an external system by means of a cable of the circuit board 50. The timing controller 60 generates agate control signal for controlling an operation timing of the gate driver 20 and a source control signal for controlling the data driver 30 based on the timing signal. The timing controller 60 supplies the gate control signal to the gate driver 20 and supplies the source control signal to the data driver 30.

Next, the structure of pixels disposed in the display area DA of the light emitting display device 100 according to the exemplary embodiment of the present disclosure will be described in more detail with reference to FIGS. 2 to 5.

Figure 2:
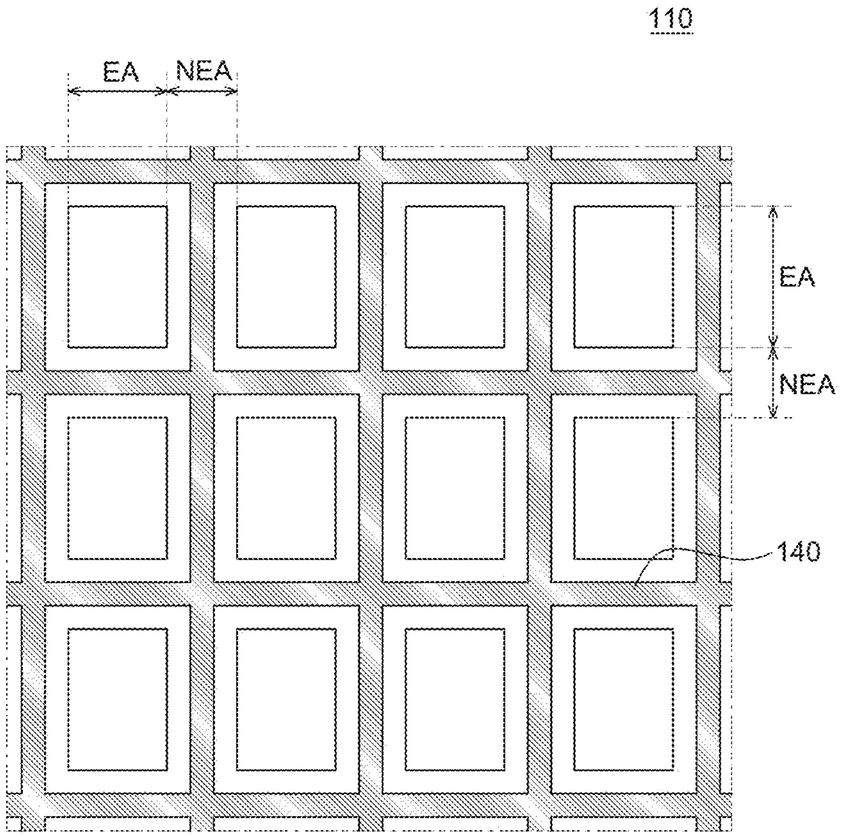
FIG. 2 is a plan view schematically illustrating a part of a display area of a light emitting display device according to an exemplary embodiment of the present disclosure.
Figure 3:
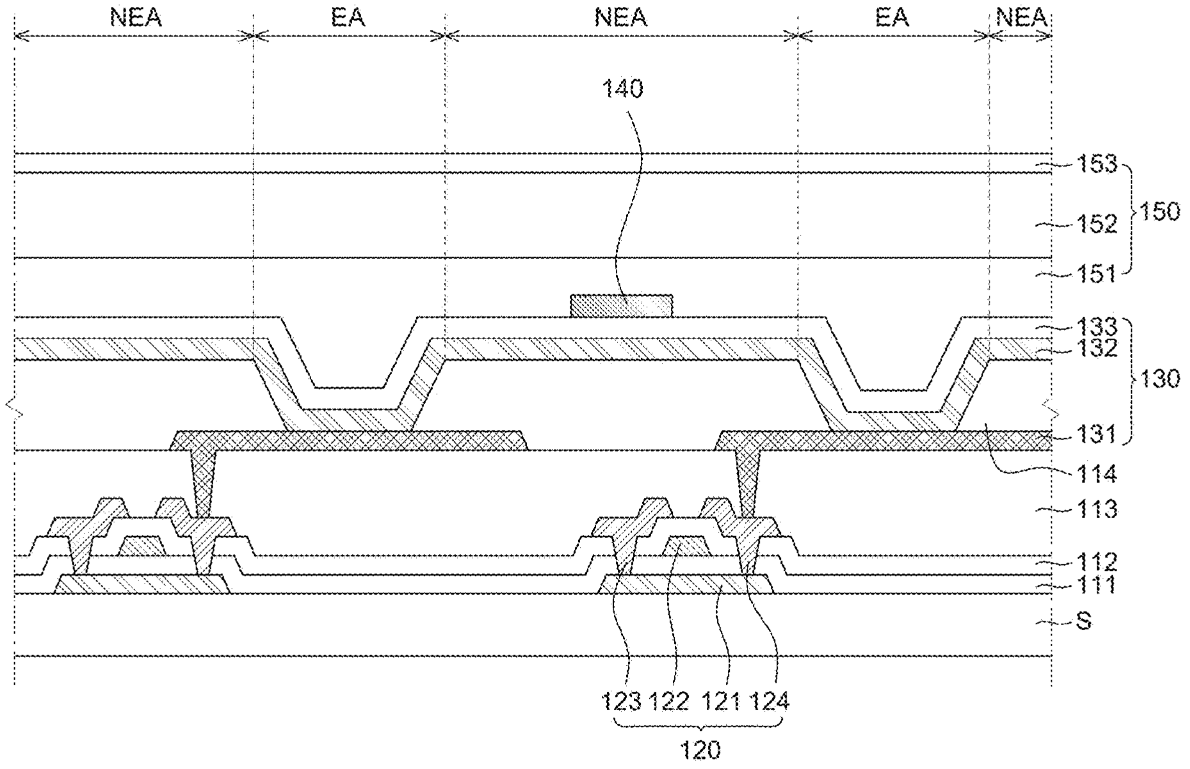
FIG. 3 is a schematic cross-sectional view of an example taken along the line III-III' of FIG. 1.
Figure 4:
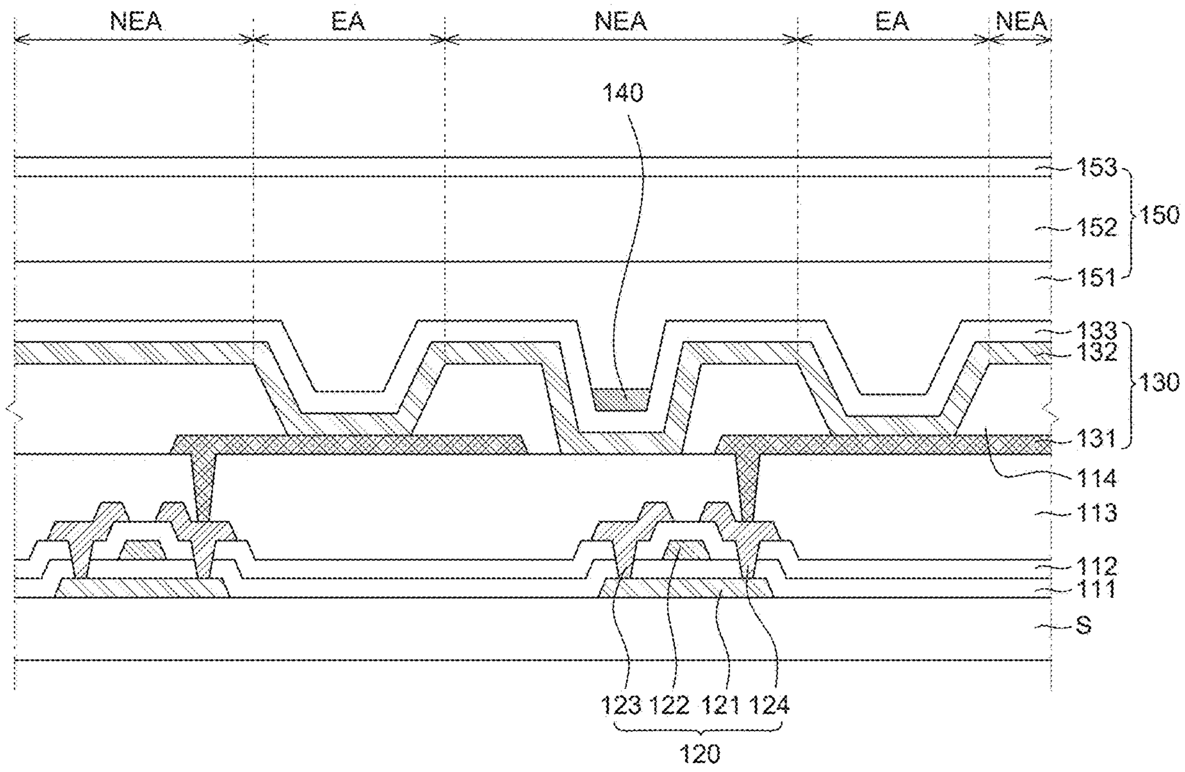
FIG. 4 is a schematic cross-sectional view of another example taken along the line III-III' of FIG. 1.
Figure 5:
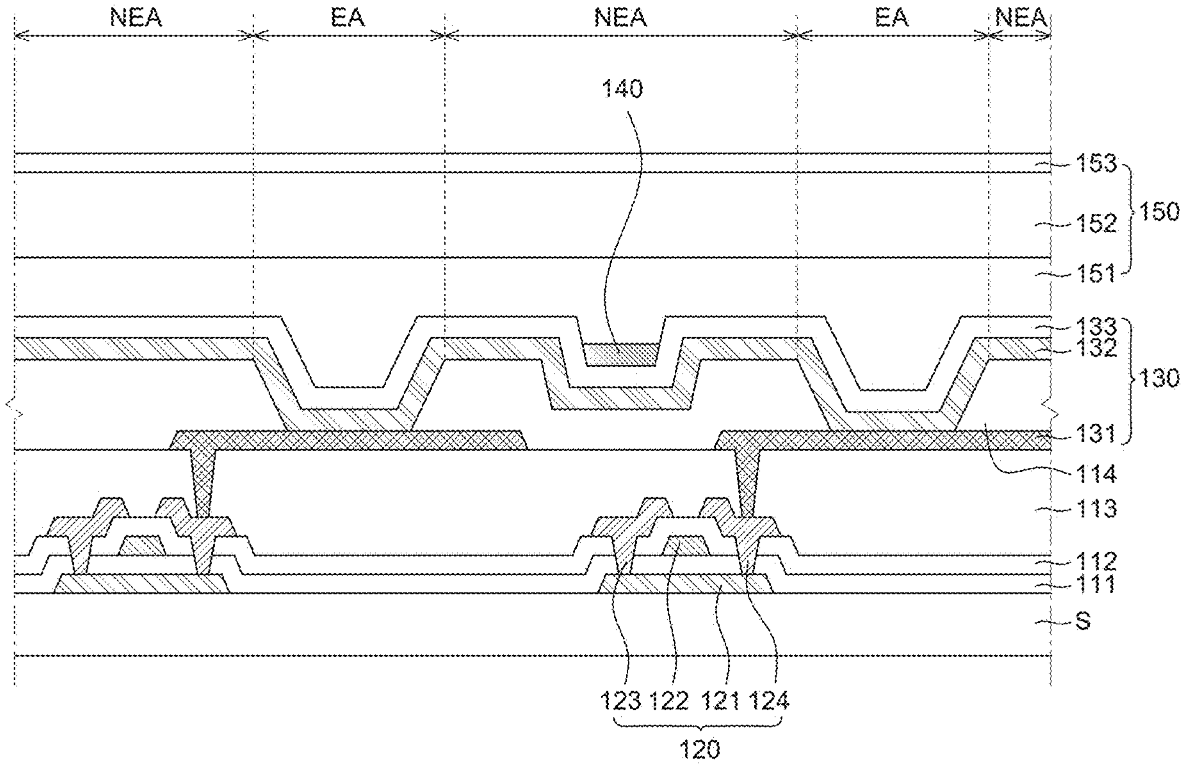
FIG. 5 is a schematic cross-sectional view of yet another example taken along the line III-III' of FIG. 1.

FIG. 2 is a plan view schematically illustrating a part of a display area of a light emitting display device according to an exemplary embodiment of the present disclosure. FIG. 3 is a schematic cross-sectional view of an example taken along the line III-III' of FIG. 1. FIG. 4 is a schematic cross-sectional view of another example taken along the line III-III' of FIG. 1. FIG. 5 is a schematic cross-sectional view of yet another example taken along the line III-III' of FIG. 1. Specifically, FIGS. 3 to 5 are cross-sectional views illustrating a display area DA of the light emitting display device 100.

First, referring to FIGS. 2 and 3, in the display area DA of the light emitting display device 100 according to the exemplary embodiment of the present disclosure, a plurality of pixels PX is disposed and each of the plurality of pixels PX includes an emitting area EA and a non-emitting area NEA.

The emitting area EA may be an area in which light emitting diodes emitting red light, green light, and blue light are disposed.

The non-emitting area NEA is an area in which gate lines, data lines, transistors for driving each pixel PX, and a hydrogen trapping layer 140 for suppressing the spreading of hydrogens of the encapsulation layer onto the transistors are disposed. The non-emitting area NEA may be disposed so as to enclose the emitting area EA and the hydrogen trapping layer 140 may also be disposed so as to enclose the emitting area EA.

In order to see the detailed structure of the emitting area EA and the non-emitting area NEA in the display area DA, first, referring to FIG. 3, in the display area DA, a substrate S, a gate insulating layer 111, an interlayer insulating layer 112, a planarization layer 113, a transistor 120, a light emitting diode 130, a hydrogen capturing layer 140, and an encapsulation layer 150 may be disposed.

The substrate S supports various components of the light emitting display device 100. The substrate S may be formed of an insulating material, for example, a transparent insulating material, such as glass or plastic.

In the non-emitting area NEA of the substrate S, the transistor 120 which drives each pixel PX is disposed. The transistor 120 includes a semiconductor layer 121, a gate electrode 122, a source electrode 123, and a drain electrode 124.

The semiconductor layer 121 is disposed on the substrate S. For example, the semiconductor layer 121 may be formed of an oxide semiconductor such as indium-gallium-zinc-oxide.

Both ends of the semiconductor layer 121 operate as a source region and a drain region which is exposed through a contact hole formed in the gate insulating layer 111 and the interlayer insulating layer 112 to be conducted. A center area overlapping the gate electrode 122 disposed above the semiconductor layer 121 operates as a channel region.

The gate insulting layer 111 is disposed on the substrate S and the semiconductor layer 121. The gate insulating layer 111 may be formed of silicon oxide SiOx, silicon nitride SiNx, or multiple layers thereof.

The gate electrode 122 is disposed on the gate insulating layer 111. The gate electrode 122 is disposed so as to overlap the semiconductor layer 121 on the gate insulating layer 111. The gate electrode 122 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

The interlayer insulating layer 112 is disposed on the gate insulating layer 111 and the gate electrode 122. The interlayer insulating layer 112 may be formed of silicon oxide SiOx, silicon nitride SiNx, or multiple layers thereof.

The source electrode 123 and the drain electrode 124 are disposed on the interlayer insulating layer 112. The source electrode 123 and the drain electrode 124 are electrically connected to the semiconductor layer 121 through the contact hole formed in the gate insulating layer 111 and the interlayer insulating layer 112. The source electrode 123 and the drain electrode 124 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

Even though it is not illustrated, a buffer layer may be located between the substrate S and the transistor 120, specifically, between the substrate S and the semiconductor layer 121. The buffer layer is a layer for protecting the transistor from impurities such as alkali ions leaked from the substrate S or layers therebelow. The buffer layer may be formed of silicon oxide SiOx, silicon nitride SiNx, or multiple layers thereof.

The planarization layer 113 is disposed on the transistor 120. The planarization layer 113 protects the transistor 120 and planarizes an upper portion of the transistor 120. For example, the planarization layer 113 may be formed of an organic insulating layer such as benzocyclobutene (BCB) or acryl, but is not limited thereto.

The light emitting diode 130 is disposed on the planarization layer 113. The light emitting diode 130 includes a first electrode 131, a light emitting layer 132, and a second electrode 133.

The first electrode 131 is formed on the planarization layer 113 so as to correspond to the emitting area EA of each pixel PX. The first electrode 131 may be an anode electrode and is electrically connected to the drain electrode 124 of the transistor 120 through a contact hole of the planarization layer 113. The first electrode 131 is formed of a metal material having a high work function. When the light emitting display device 100 is a top emission type, the first electrode 131 may further include a transparent conductive layer and a reflective layer on the transparent conductive layer. The transparent conductive layer may be formed of transparent conductive oxide such as ITO or IZO and the reflective layer is formed of silver (Ag), aluminum (Al), gold (Au), molybdenum (Mo), tungsten (W), chrome (Cr), or an alloy thereof.

The bank layer 114 is formed in the remaining area excluding the emitting area EA, that is, in the non-emitting area NEA. Therefore, the bank layer 114 defines the emitting area EA and exposes the first electrode 131 corresponding to the emitting area EA. The bank layer 114 may be formed of an inorganic insulating material such as a silicon nitride film (SiNx) or a silicon oxide film (SiOx) or an organic insulating material such as benzocyclobutene (BCB)-based resin, acrylic-based resin or imide-based resin, but is not limited thereto.

The light emitting layer 132 is disposed on the first electrode 131 exposed by the bank layer 114. The light emitting layer 132 includes a hole injection layer, a hole transport layer, a light emitting layer, an electron transport layer, and an electron injection layer. The light emitting layer 132 may be configured with a single emission layer structure which emits single light or may be configured with a structure which is configured by a plurality of emission layers to emit white light.

The second electrode 133 is disposed along the surface of the light emitting layer 132 and the bank layer 114. That is, the second electrode 133 may be formed in both the emitting area EA and the non-emitting area NEA and at this time, the second electrode 133 may be a cathode electrode. When the light emitting display device 100 is a top emission type, the second electrode 133 may be formed of a metal material having a small thickness and a high work function.

The hydrogen trapping layer 140 is formed on the bank layer 114. To be more specific, the hydrogen trapping layer 140 is formed on the second electrode 133 in a center portion of the bank layer 114 of the non-emitting area NEA. The hydrogen trapping layer 140 is coupled to hydrogens H included in the encapsulation layer 150 to suppress the spreading of the hydrogens onto the transistor 120.

The hydrogen trapping layer 140 may be formed of a material which thermodynamically forms a stable bond with the hydrogen, and for example, one of lithium (Li), sodium (Na), magnesium (Mg), potassium (K), calcium (Ca), scandium (Sc), titanium (Ti), vanadium (V), rubidium (Rb), strontium (Sr), yttrium (Y), zirconium (Zr), niobium (Nb), cesium (Cs), barium (Ba), lutetium (Lu), hafnium (Hf), tantalum (Ta), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), thorium (Th), protactinium (Pa), uranium (U), neptunium (Np), plutonium (Pu) and americium (Am) or an alloy thereof. Among these materials, the most preferable material for the hydrogen trapping layer 140 may be titanium (Ti) used to manufacture the transistor 120.

The hydrogen trapping layer 140 may be formed by a soluble process. The hydrogen trapping layer 140 is formed by the soluble process because the hydrogen trapping layer 140 is formed after forming the light emitting diode 130 so that the light emitting diode 130 is likely to be damaged when the hydrogen trapping layer 140 is deposited at a high temperature. Further, the hydrogen trapping layer 140 which is formed of the metal material cannot be deposited using a fine metal mask (FMM). As described above, the hydrogen trapping layer 140 is formed by the soluble process. Therefore, even though it is illustrated on the drawing that the hydrogen trapping layer 140 is formed to have an angular shape on the bank layer 114, actually, the upper surface may have a slightly convex shape like a water droplet. Such a hydrogen trapping layer 140 is not formed only on the bank layer 114 of the non-emitting area NEA as illustrated in FIG. 3.

As illustrated in FIG. 4, after forming a hole in a center portion of the bank layer 114 of the non-emitting area NEA to expose an upper surface of the planarization layer 113, the hydrogen trapping layer 140 may be formed in the hole.

As illustrated in FIG. 5, after forming a hole having a thickness which is half the thickness of the bank layer 114, rather than fully forming a hole in the center portion of the bank layer 114 of the non-emitting area NEA to expose the upper surface of the planarization layer 113, the hydrogen trapping layer 140 may be formed in the hole. As described above, when the hydrogen trapping layer 140 is formed in the hole of the bank layer 114, the hydrogen trapping layer 140 may be formed by a soluble process. As described above, when the hydrogen trapping layer 140 is formed by a soluble process, an upper surface of the hydrogen trapping layer 140 has a convex shape. Further, the hydrogen trapping layer 140 is formed after forming holes in the bank layer 114 so that it is much easier to form the hydrogen trapping layer 140 by the soluble process.

An encapsulation layer 150 is disposed on the second electrode 133 and the hydrogen trapping layer 140. The encapsulation layer 150 may protect the light emitting diode 130 from the moisture and oxygen. When the light emitting diode 130 is exposed to the moisture or oxygen, pixel shrinkage phenomenon in which the light emitting diode 130 is shrunk is caused or a dark spot is generated in the emitting area.

For example, the encapsulation layer 150 includes a first inorganic encapsulation layer 151, an organic encapsulation layer 152 on the first inorganic encapsulation layer 151, and a second inorganic encapsulation layer 153 on the organic encapsulation layer 152.

The first inorganic encapsulation layer 151 and the second inorganic encapsulation layer 153 are formed by inorganic insulating layers. For example, the first inorganic encapsulation layer 151 and the second inorganic encapsulation layer 153 may be formed of an inorganic insulating material such as silicon nitride (SiNx), silicon oxide (SiOx), silicon oxynitride (SiON), or aluminum oxide (Al2O3). The organic encapsulation layer 152 is formed by an organic insulating layer. The second inorganic encapsulation layer 153 covers upper surfaces and side surfaces of the first inorganic encapsulation layer 151 and the organic encapsulation layer 152. The second inorganic encapsulation layer 153 minimizes or blocks external moisture or oxygen from permeating the first inorganic encapsulation layer 151 and the organic encapsulation layer 152. At this time, the first inorganic encapsulation layer 151 and the second inorganic encapsulation layer 153 serve to block the permeation of moisture or oxygen and the organic encapsulation layer 152 serves to planarize an upper portion of the first inorganic encapsulation layer 151. However, a configuration of the encapsulation layer 150 is not limited thereto.

Figure 6:
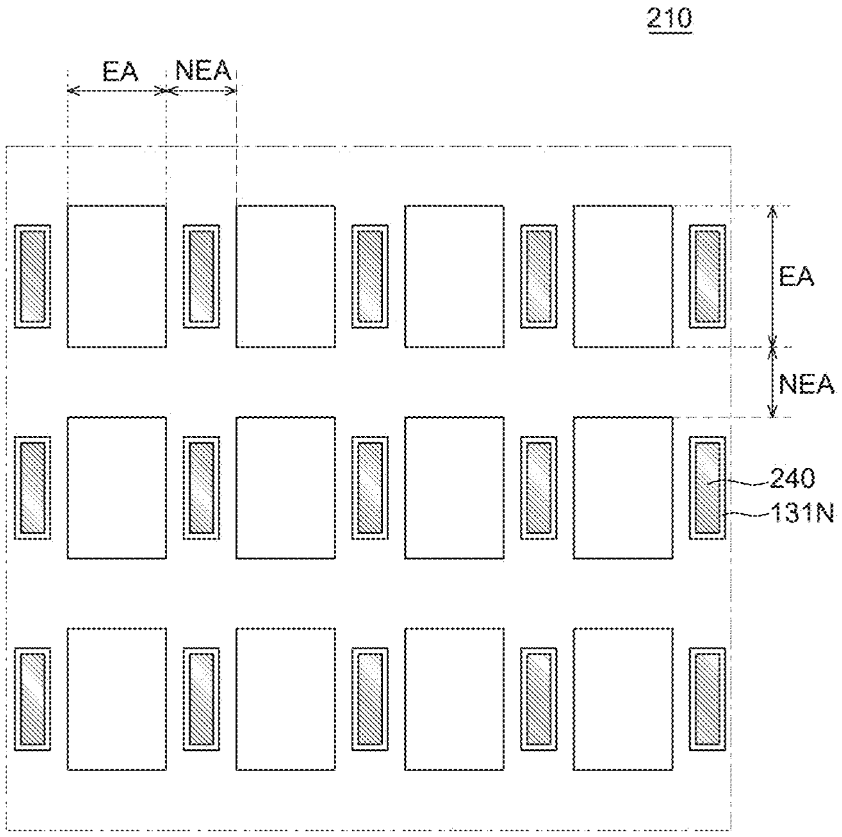
FIG. 6 is a plan view schematically illustrating a part of a display area of a light emitting display device according to another exemplary embodiment of the present disclosure.
Figure 7:
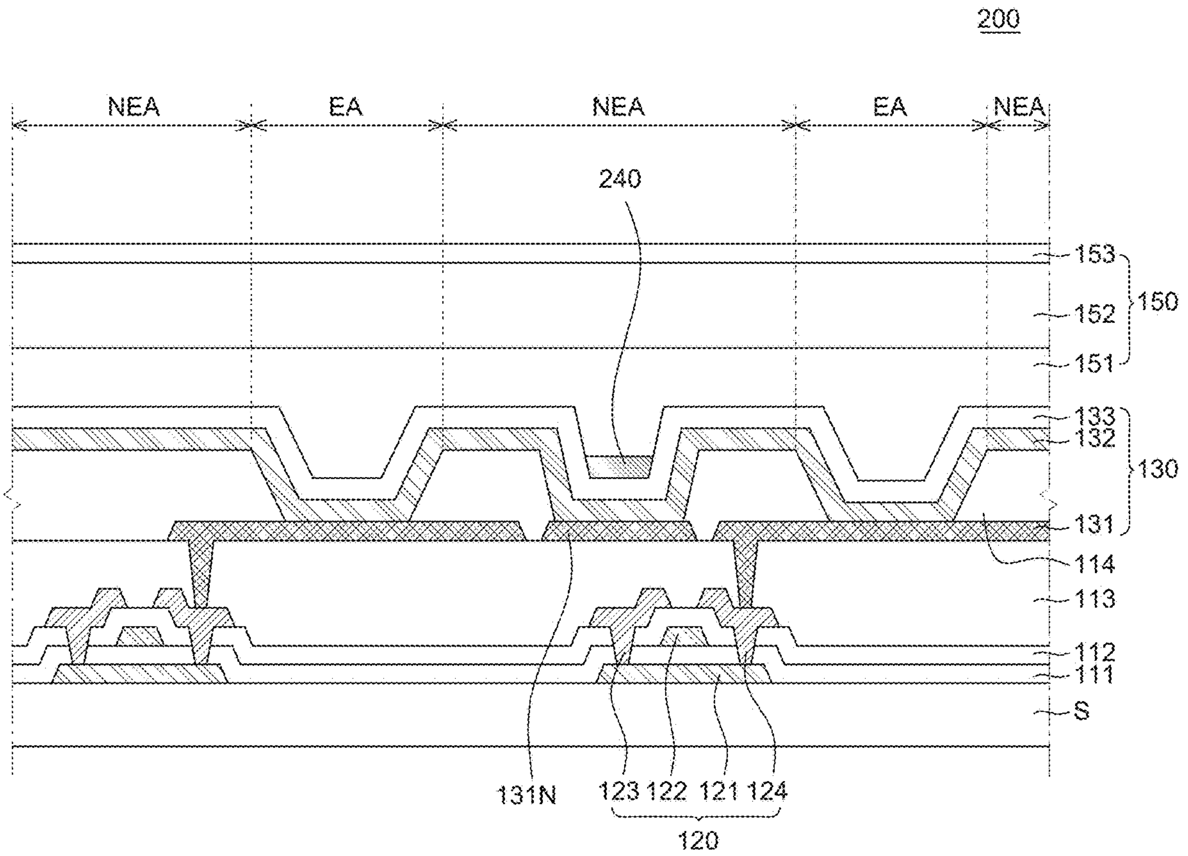
FIG. 7 is a cross-sectional view schematically illustrating a structure of some pixels of FIG. 6.

FIG. 6 is a plan view schematically illustrating a part of a display area of a light emitting display device according to another exemplary embodiment of the present disclosure. FIG. 7 is a cross-sectional view schematically illustrating a structure of some pixels of FIG. 6.

Referring to FIGS. 6 and 7, in the display area of the display panel 210 of the light emitting display device 200 according to the exemplary embodiment of the present disclosure, a plurality of pixels PX is disposed and each of the plurality of pixels PX includes an emitting area EA and a non-emitting area NEA. The emitting area EA is an area in which light emitting diodes emitting red light, green light, and blue light are disposed and the non-emitting area NEA is an area in which the gate lines, the data lines, and transistors for driving the pixels PX are disposed.

Further, in the non-emitting area NEA, a first hydrogen trapping layer 131N and a second hydrogen trapping layer 240 which suppress dispersion of hydrogens of the encapsulation layer 150 to the transistor 120 may be disposed. To be more specific, the first hydrogen trapping layer 131N is referred to as a hydrogen trapping assisting layer which helps the second hydrogen trapping layer 240 formed of a material which is stably coupled to hydrogen to trap the hydrogens to improve a hydrogen trapping efficiency. The second hydrogen trapping layer 240 is referred to as a hydrogen trapping layer serving to trap the hydrogens of the encapsulation layer 150. As illustrated in FIG. 6, the first hydrogen trapping layer 131N and the second hydrogen trapping layer 240 may be disposed in the column direction of the non-emitting area NEA to correspond to a width of the emitting area EA in the column direction.

The first hydrogen trapping layer 131N may be disposed on the planarization layer 113 of the non-emitting area NEA, as illustrated in FIG. 7. The first hydrogen trapping layer 131N may be simultaneously formed with the formation of the first electrode 131 and formed of the same material as the first electrode 131, for example, a metallic material having a high work function. To be more specific, the first hydrogen trapping layer 131N includes a transparent conductive layer and a reflective layer on the transparent conductive layer. The transparent conductive layer may be formed of transparent conductive oxide such as ITO or IZO and the reflective layer is formed of silver (Ag), aluminum (Al), gold (Au), molybdenum (Mo), tungsten (W), chrome (Cr), or an alloy thereof.

A surface of the first hydrogen trapping layer 131N is formed with roughness. That is, a roughness of the surface of the first hydrogen trapping layer 131N may be larger than a roughness of a surface of the first electrode 131. Here, when the surface is formed with roughness, it means that a surface is formed to be uneven to have a surface roughness value. The first hydrogen trapping layer 131N is selectively subjected to hydrogen plasma treatment and the roughness of the first hydrogen trapping layer 131N is formed by the hydrogen plasma treatment. As described above, when the surface of the first hydrogen trapping layer 131N is formed with roughness, the surface of the second electrode 133 disposed in an area overlapping the first hydrogen trapping layer 131N is also formed with roughness. Therefore, when the second hydrogen trapping layer 240 is formed on the second electrode 133, materials which configure the second hydrogen trapping layer 240 are well spread so that the surface of the second hydrogen trapping layer 240 is increased. As described above, when the formation surface of the second hydrogen trapping layer 240 is increased, a hydrogen trapping effect is further improved.

The second hydrogen trapping layer 240 may be formed on the bank layer 114 disposed in the non-emitting area NEA. At this time, after forming a hole in a center portion of the bank layer 114 to expose the first hydrogen trapping layer 131N formed on the planarization layer 113, the second hydrogen trapping layer 240 is formed in the hole. At this time, the second hydrogen trapping layer 240 may be disposed so as to overlap the first hydrogen trapping layer 131N. Further, even though in FIG. 7, it is illustrated that the second hydrogen trapping layer 240 is formed in the hole formed in the bank layer 114, it is not limited thereto. Therefore, as descried with reference to FIG. 3, the second hydrogen trapping layer 240 may be formed on the bank layer 114. Further, after forming a hole with a depth which is approximately half the thickness of the bank layer 114, the second hydrogen trapping layer 240 may be formed in the hole.

The second hydrogen trapping layer 240 may be formed of a material which thermodynamically forms a stable bond with the hydrogen, and for example, one of lithium (Li), sodium (Na), magnesium (Mg), potassium (K), calcium (Ca), scandium (Sc), titanium (Ti), vanadium (V), rubidium (Rb), strontium (Sr), yttrium (Y), zirconium (Zr), niobium (Nb), cesium (Cs), barium (Ba), lutetium (Lu), hafnium (Hf), tantalum (Ta), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), thorium (Th), protactinium (Pa), uranium (U), neptunium (Np), plutonium (Pu), and americium (Am) or an alloy thereof. The second hydrogen trapping layer 240 may be formed by a soluble inkjet process.

The first hydrogen trapping layer 131N and the second hydrogen trapping layer 240 disposed in the non-emitting area NEA may be disposed in the non-emitting area NEA in various forms.

Figure 8:
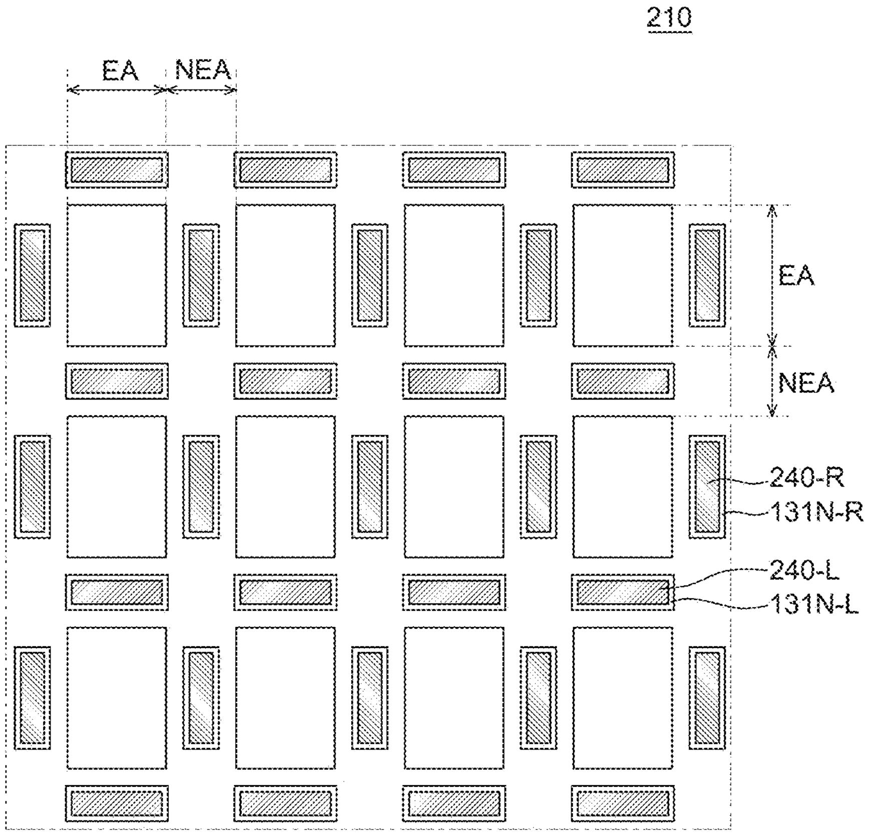
FIG. 8 is a plan view schematically illustrating a part of a display area of a light emitting display device according to still another exemplary embodiment of the present disclosure.
Figure 9:
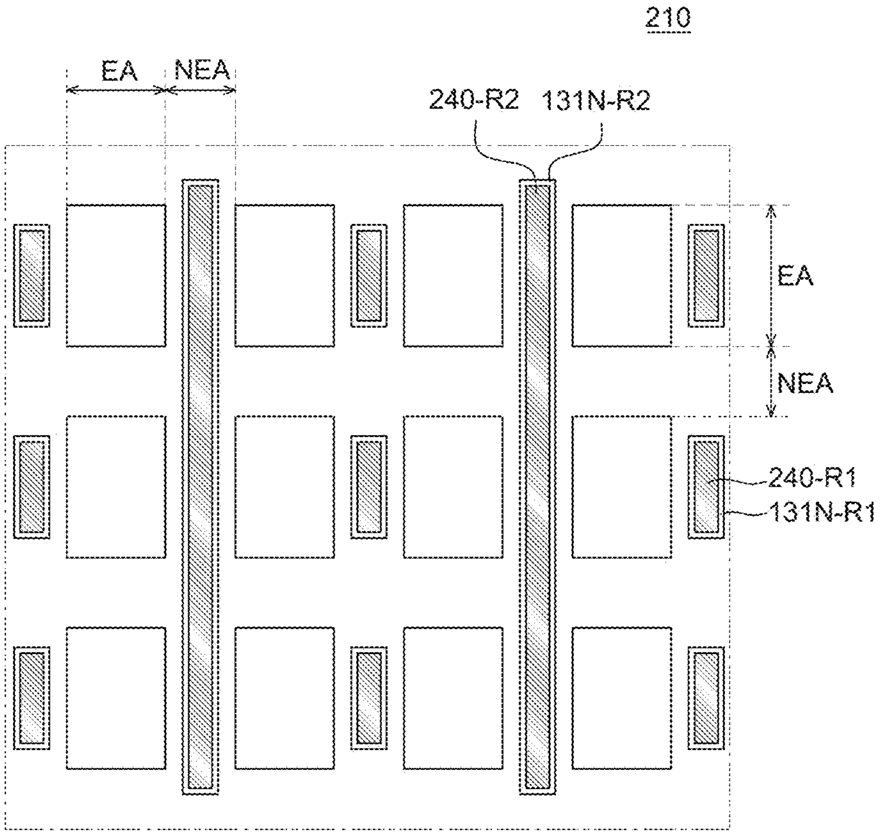
FIG. 9 is a plan view schematically illustrating a part of a display area of a light emitting display device according to still another exemplary embodiment of the present disclosure.

FIG. 8 is a plan view schematically illustrating a part of a display area of a light emitting display device according to still another exemplary embodiment of the present disclosure. FIG. 9 is a plan view schematically illustrating a part of a display area of a light emitting display device according to still another exemplary embodiment of the present disclosure.

Referring to FIG. 8, first hydrogen trapping layers 131N-R and 131N-L and second hydrogen trapping layers 240-R and 240-L of a light emitting display device according to still another exemplary embodiment of the present disclosure are disposed in the non-emitting area NEA to enclose the emitting area EA. However, the first hydrogen trapping layers 131N-R and 131N-L are disposed to be spaced apart from each other with a predetermined interval and the second hydrogen trapping layers 240-R and 240-L are disposed to be spaced apart from each other with a predetermined interval. To be more specific, the first hydrogen trapping layers 131N-R and 131N-L and the second hydrogen trapping layers 240-R and 240-L may be disposed to correspond to a width of a row and a width of a column of the emitting area EA. As illustrated in FIG. 8, when the first hydrogen trapping layers 131N-R and 131N-L and the second hydrogen trapping layers 240-R and 240-L are disposed, the hydrogen trapping area is wider than that of the exemplary embodiment illustrated in FIG. 6 so that the hydrogen trapping effect is further improved.

In the meantime, the first hydrogen trapping layers 131N-R1 and 131N-R2 and the second hydrogen trapping layers 240-R1 and 240-R2 of the light emitting display device according to still another exemplary embodiment of the present disclosure are disposed only in a column direction in the non-emitting area NEA. The first hydrogen trapping layer 131N-R1 and the second hydrogen trapping layer 240-R1 disposed in a first column are formed to correspond to the width of the emitting area EA and the first hydrogen trapping layer 131N-R2 and the second hydrogen trapping layer 240-R2 disposed in a second column are disposed as an integrated line. As illustrated in FIG. 9, when the first hydrogen trapping layers 131N-R1 and 131N-R2 and the second hydrogen trapping layers 240-R1 and 240-R2 are disposed, the hydrogen trapping area is wider than that of the exemplary embodiment illustrated in FIG. 8 so that the hydrogen trapping effect is further improved.

Further, even though not illustrated, the first hydrogen trapping layer 131N and the second hydrogen trapping layer 240 may be disposed in the non-emitting area NEA to enclose the emitting area EA as illustrated in FIG. 2. As described above, when the first hydrogen trapping layer 131N and the second hydrogen trapping layer 240 are formed in the non-emitting area NEA to enclose the emitting area EA without being spaced apart from each other, an area which traps the hydrogen is increased so that the hydrogen trapping effect is further improved.

The exemplary embodiments of the present disclosure can also be described as follows:

According to an aspect of the present disclosure, a light emitting display device, may comprise: a transistor disposed on a substrate; a planarization layer disposed on the transistor; a light emitting diode disposed on the planarization layer; a bank layer disposed in a non-emitting area so as to define an emitting area of the light emitting diode; a hydrogen trapping layer disposed in the non-emitting area; and an encapsulation layer disposed on the bank layer and the hydrogen trapping layer.

The hydrogen trapping layer may be formed of one of lithium (Li), sodium (Na), magnesium (Mg), potassium (K), calcium (Ca), scandium (Sc), titanium (Ti), vanadium (V), rubidium (Rb), strontium (Sr), yttrium (Y), zirconium (Zr), niobium (Nb), cesium (Cs), barium (Ba), lutetium (Lu), hafnium (Hf), tantalum (Ta), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), thorium (Th), protactinium (Pa), uranium (U), neptunium (Np), plutonium (Pu), and americium (Am) or an alloy thereof.

The hydrogen trapping layer may be formed by a soluble process.

The hydrogen trapping layer may be formed on the bank layer.

The hydrogen trapping layer may be formed in a hole after forming the hole in the bank layer so as to expose an upper portion of the planarization layer.

The hydrogen trapping layer may be formed in a hole after forming the hole in the bank layer to have a thickness which is half a thickness of the bank layer.

The transistor may be formed of an oxide semiconductor material.

According to another aspect of the present disclosure, a light emitting display device, may comprise: a transistor disposed on a substrate; a planarization layer disposed on the transistor; a light emitting diode formed by sequentially disposing a first electrode, a light emitting layer, and a second electrode on the planarization layer; a bank layer disposed in a non-emitting area so as to define an emitting area of the light emitting diode; a first hydrogen trapping layer disposed on the planarization layer of the non-emitting area; a second hydrogen trapping layer which is disposed on the first hydrogen trapping layer so as to overlap the first hydrogen trapping layer; and an encapsulation layer disposed on the bank layer and the second hydrogen trapping layer.

The first hydrogen trapping layer may be formed of the same material as the first electrode.

A roughness of a surface of the first hydrogen trapping layer may be larger than a roughness of a surface of the first electrode.

The first hydrogen trapping layer may be selectively subjected to hydrogen plasma treatment.

The second hydrogen trapping layer may be disposed on the bank layer or is formed in a hole after forming the hole in the bank layer.

The first hydrogen trapping layer and the second hydrogen trapping layer may be disposed in a partial area of the non-emitting area or disposed to enclose the emitting area.

It will be apparent to those skilled in the art that various modifications and variations can be made in the light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display device, comprising:
- a plurality of transistors disposed on a substrate;
- a planarization layer disposed on the plurality transistors;
- a plurality of light emitting diodes disposed on the planarization layer, each of the plurality of light emitting diodes including a first electrode, a light emitting layer on the first electrode, and a second electrode on the light emitting layer;
- a bank layer disposed in a non-emitting area to define emitting areas of the plurality of light emitting diodes;
- a hydrogen trapping layer disposed in the non-emitting area of the display area among the non-emitting area of the display area and the emitting areas; and
- an encapsulation layer disposed on the bank layer and the hydrogen trapping layer,
- wherein the hydrogen trapping layer is disposed between the second electrode of the plurality of light emitting diodes and the encapsulation layer,
- wherein the hydrogen trapping layer is in direct contact with the second electrode,
- wherein the bank layer includes a hole disposed between adjacent emitting areas in a display area of the light emitting display device, and
- wherein the hydrogen trapping layer is disposed only in the hole.

2. The light emitting display device according to claim 1, wherein the hydrogen trapping layer is formed of one of lithium, Li, sodium, Na, magnesium, Mg, potassium, K, calcium, Ca, scandium, Sc, titanium, Ti, vanadium, V, rubidium, Rb, strontium, Sr, yttrium, Y, zirconium, Zr, niobium, Nb, cesium, Cs, barium, Ba, lutetium, Lu, hafnium, Hf, tantalum, Ta, lanthanum, La, cerium, Ce, praseodymium, Pr, neodymium, Nd, samarium, Sm, gadolinium, Gd, terbium, Tb, dysprosium, Dy, holmium, Ho, erbium, Er, thulium, Tm, ytterbium, Yb, thorium, Th, protactinium, Pa, uranium, U, neptunium, Np, plutonium, Pu, and americium, Am or an alloy thereof.

3. The light emitting display device according to claim 2, wherein the hydrogen trapping layer is formed by a soluble process.

4. The light emitting display device according to claim 1, wherein the hydrogen trapping layer is on the bank layer.

5. The light emitting display device according to claim 1, wherein an upper portion of the planarization layer is exposed by the hole.

6. The light emitting display device according to claim 1, wherein the hydrogen trapping layer has a thickness that is half of a thickness of the bank layer.

7. The light emitting display device according to claim 1, wherein the plurality of transistors includes an oxide semiconductor material.

8. A light emitting display device, comprising:
- a transistor disposed on a substrate;
- a planarization layer disposed on the transistor;
- a light emitting diode sequentially including a first electrode, a light emitting layer, and a second electrode on the planarization layer;
- a bank layer disposed in a non-emitting area to define an emitting area of the light emitting diode;
- a first hydrogen trapping layer disposed on the planarization layer of the non-emitting area;
- a second hydrogen trapping layer disposed on the first hydrogen trapping layer to overlap the first hydrogen trapping layer; and
- an encapsulation layer disposed on the bank layer and the second hydrogen trapping layer,
- wherein the first hydrogen trapping layer and the second hydrogen trapping layer is spaced apart from each other, wherein the second hydrogen trapping layer is disposed between the second electrode and the encapsulation layer, and wherein the second hydrogen trapping layer is in direct contact with the second electrode, wherein the bank layer includes a hole disposed in the non-emitting area between adjacent pixels, and wherein the second hydrogen trapping layer is disposed only in the hole.

9. The light emitting display device according to claim 8, wherein the first hydrogen trapping layer includes a same material as the first electrode.

10. The light emitting display device according to claim 9, wherein the first hydrogen trapping layer is selectively subjected to hydrogen plasma treatment.

11. The light emitting display device according to claim 8, wherein the second hydrogen trapping layer is disposed on the bank layer or is disposed in a hole defined in the bank layer.

12. The light emitting display device according to claim 8, wherein the first hydrogen trapping layer and the second hydrogen trapping layer are disposed in a partial area of the non-emitting area or disposed to enclose the emitting area.

13. A light emitting display device comprising a plurality of pixels, in each of which an emitting area and a non-emitting area are defined, wherein each pixel comprises:

a transistor disposed in the non-emitting area;

a planarization layer disposed on the transistor;

a light emitting diode disposed on the planarization layer, the light emitting diode including a first electrode, a light emitting layer on the first electrode, and a second electrode on the light emitting layer;

a bank layer disposed on the planarization layer to define the emitting area;

a hydrogen trapping layer disposed in the non-emitting area of the display area among the non-emitting area of the display area and the emitting areas; and an encapsulation layer disposed on the bank layer and the hydrogen trapping layer, wherein the hydrogen trapping layer is disposed between the second electrode of the light emitting diode and the encapsulation layer, and wherein the hydrogen trapping layer is in direct contact with the second electrode, wherein the plurality of pixels are disposed in a display area of the light emitting display device, wherein the bank layer includes a hole disposed in the non-emitting area between adjacent pixels, and wherein the hydrogen trapping layer is disposed only in the hole.

14. The light emitting display device according to claim 13, wherein the hydrogen trapping layer includes a material which thermodynamically forms a stable bond with hydrogen.

15. The light emitting display device according to claim 13, wherein each pixel further comprises a hydrogen trapping assisting layer that overlaps with the hydrogen trapping layer, and wherein the hydrogen trapping assisting layer is formed on a same layer as the first electrode.

16. The light emitting display device according to claim 13, wherein the first electrode is in direct contact with the planarization layer.

17. The light emitting display device according to claim 8, wherein the first electrode is in direct contact with the planarization layer.

18. The light emitting display device according to claim 1, wherein the first electrode is in direct contact with the planarization layer.

* * * * *